United States Patent [19]

Matthews

[11] Patent Number: 4,474,624

[45] Date of Patent: Oct. 2, 1984

[54] PROCESS FOR FORMING SELF-ALIGNED COMPLEMENTARY SOURCE/DRAIN REGIONS FOR MOS TRANSISTORS

[75] Inventor: James A. Matthews, Santa Clara, Calif.

[73] Assignee: Intel Corporation, Santa Clara, Calif.

[21] Appl. No.: 397,055

[22] Filed: Jul. 12, 1982

[51] Int. Cl.³ .......................................... H01L 21/265
[52] U.S. Cl. .................................... 148/1.5; 148/187; 29/571; 357/42; 357/91
[58] Field of Search .................. 148/1.5, 187; 357/42, 357/91; 29/571

[56] References Cited

U.S. PATENT DOCUMENTS

| | | | |
|---|---|---|---|
| 3,891,468 | 6/1975 | Ito et al. | 148/1.5 |
| 3,902,926 | 9/1975 | Perloff et al. | 148/1.5 |
| 4,019,247 | 4/1977 | Borel et al. | 148/1.5 |
| 4,217,149 | 8/1980 | Sawazaki | 148/1.5 |
| 4,236,167 | 11/1980 | Woods | 351/23 |
| 4,274,891 | 6/1981 | Silvestri et al. | 148/178 |
| 4,277,291 | 7/1981 | Cerofolini et al. | 148/1.5 |

*Primary Examiner*—L. Dewayne Rutledge
*Assistant Examiner*—Christopher W. Brody
*Attorney, Agent, or Firm*—Blakely, Sokoloff, Taylor & Zafman

[57] ABSTRACT

Improved CMOS processing steps for forming p-type and n-type source and drain regions. A photoresist mask is used to expose one transistor type to allow the formation of source and drain regions of a first conductivity type. Then an oxidation step is used to grow an oxide over the substrate; this oxide grows more quickly over the doped source and drain regions. Ion implantation is used to implant ions of the second conductivity type through the thin oxide while the thicker oxide blocks these ions. Thus, the complementary source and drain regions are formed with a single masking step and without counter doping.

17 Claims, 7 Drawing Figures

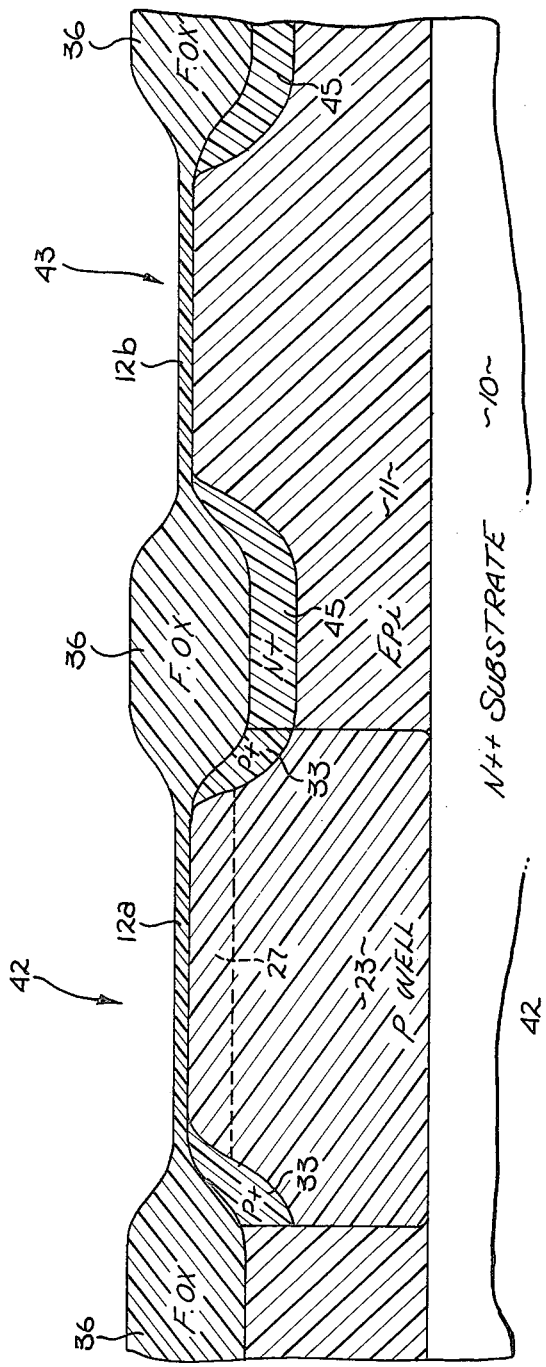
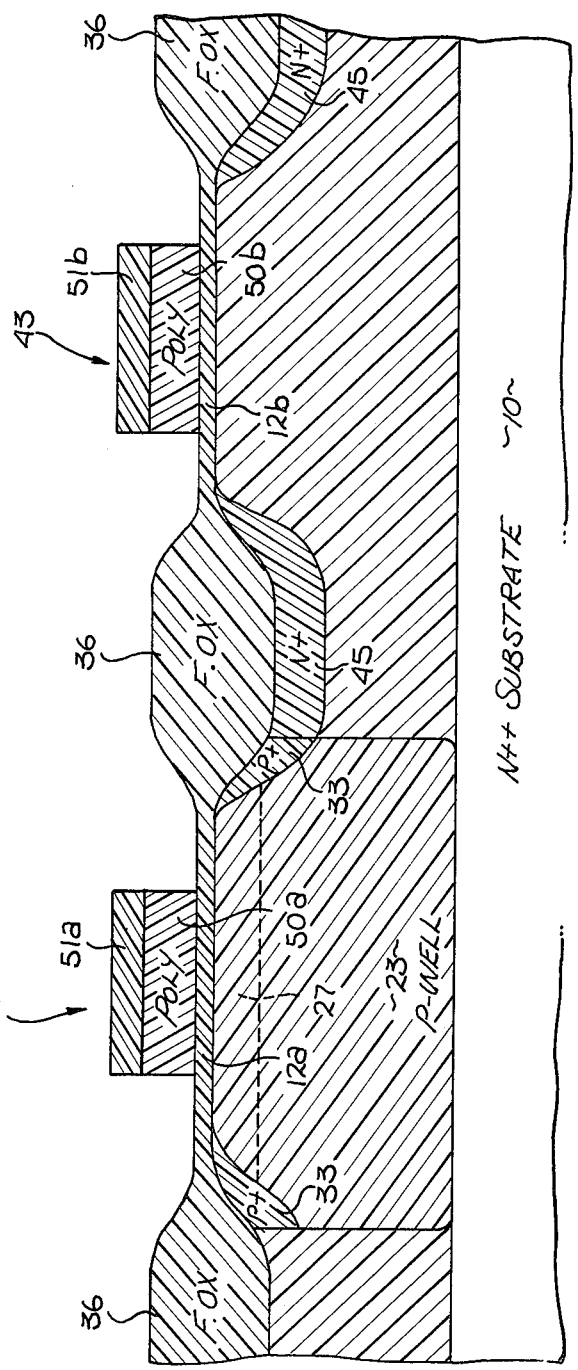

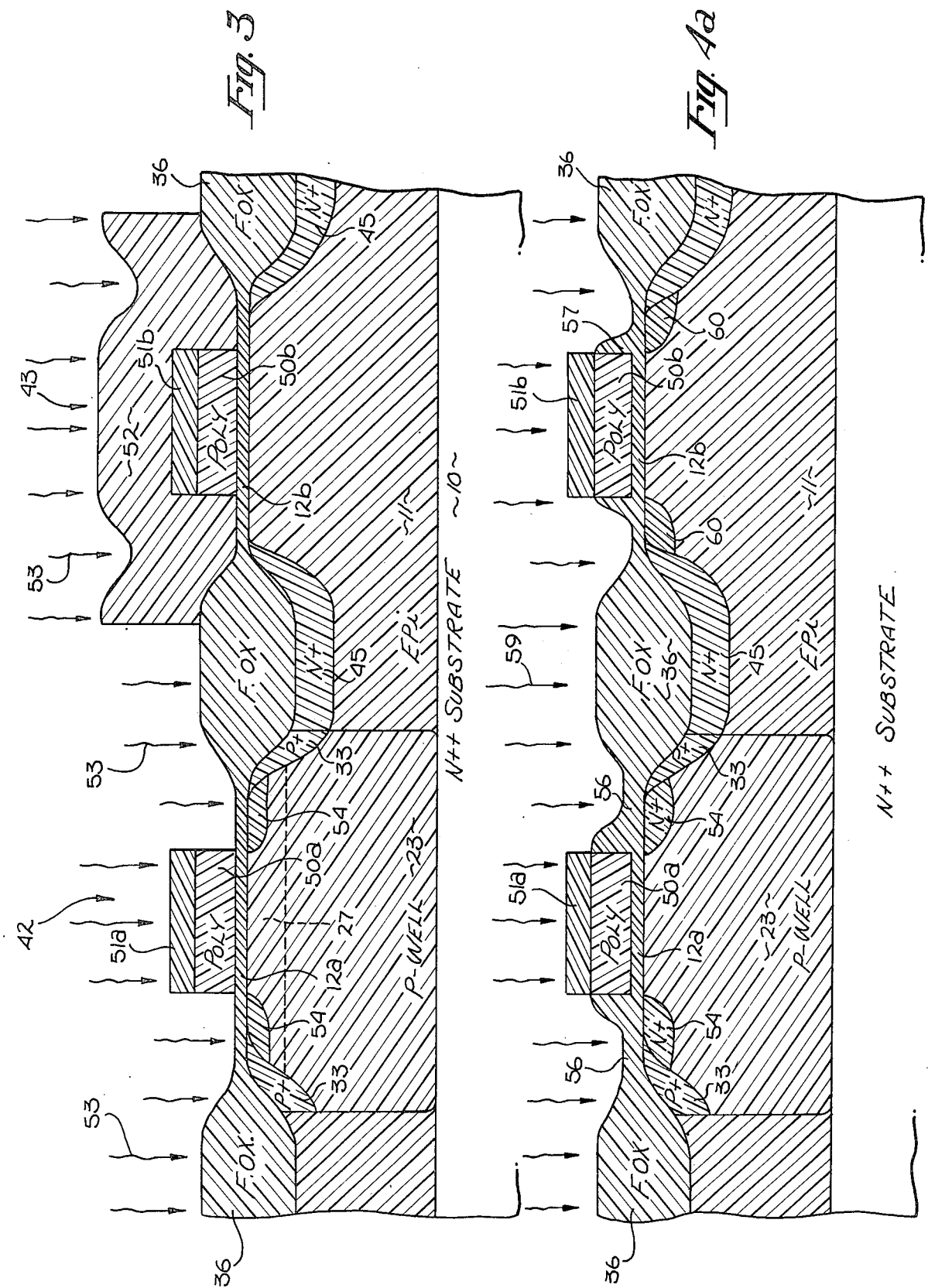

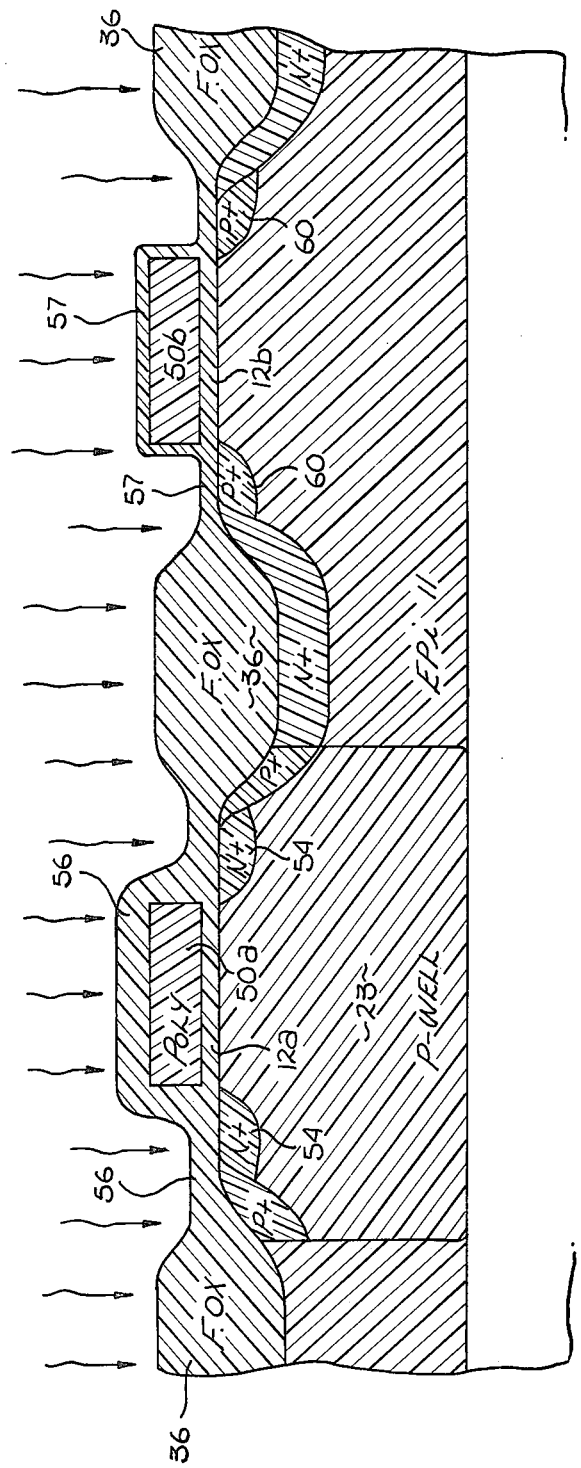
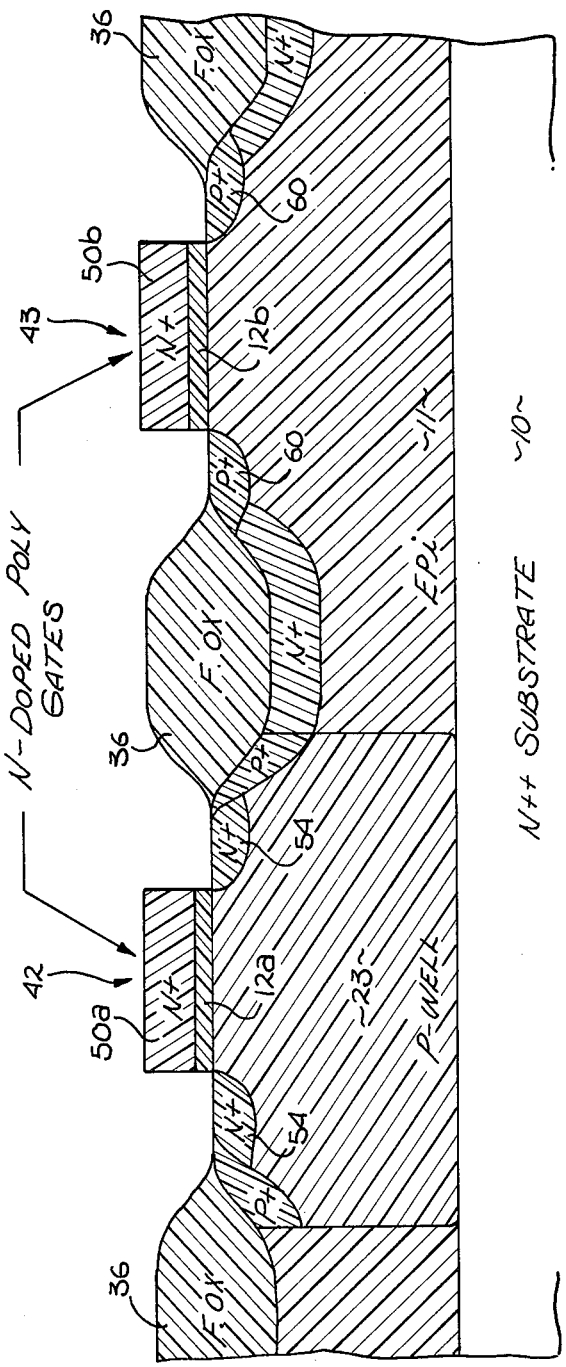

PROCESS FOR FORMING SELF-ALIGNED COMPLEMENTARY SOURCE/DRAIN REGIONS FOR MOS TRANSISTORS

BACKGROUND OF THE INVENTION

1. Field of the Invention

The invention relates to the field of complementary metal-oxide-semiconductor (CMOS) processing.

2. Prior Art

Integrated circuits employing CMOS transistors have become more widely used in recent years. These circuits are known to have a number of advantages over p-channel or n-channel circuits, such as higher noise immunity, lower power consumption and much higher resistance to "soft" failures associated with ionizing radiation.

Typically, in the fabrication of CMOS transistors two separate doping steps are used to form the source and drain regions for the n-channel transistors and the p-channel transistors. The doping levels for these regions is typically higher than the doping levels associated with other processing steps, such as ion implantation steps used to adjust threshold voltages, thus necessitating separate source/drain doping steps.

In some processes, two separate masking steps are used to dope the source/drain regions of the complementary transistors. For example, first the selected regions for the source/drain regions of the n-channel transistors are covered and a p-type dopant is implanted to form the p-channel transistors. Then, the p-channel transistors are covered with, for example, a photoresist and an n-type dopant is used to form the n-channel transistors. Obviously, this process requires two separate masking steps to form the complementary source/drain regions.

In another process, only a single masking step is used. First, by way of example, the selected regions for the source/drain regions of the n-channel transistors are covered with a photoresist and a p-type dopant is used to form the p-channel transistors. The doping level for these p-type source/drain regions is made higher than is required. Then, the photoresist is removed and the substrate is subjected to an n-type dopant. The n-type dopant forms the source/drain regions of the n-type transistors and also dopes the source/drain regions of the p-channel transistors. However, since extra dopant was used for the p-channel transistors, the counter doping from the n-type dopant does not change the conductivity type of the source/drain regions for the p-channel transistors. Thus, the complementary transistors are formed with only a single masking step. One problem with this process is that it is difficult to control the doping level in the counter doped source/drain regions.

As will be seen, the present invention permits complementary source/drain regions to be formed with a single masking step and without the counter doping. It permits the doping levels of the complementary source/drain regions to be accurately controlled. The present invention makes use of the known phenomena, specifically that oxides grow more quickly on more highly doped silicon. The invented process also permits the forming of complementary doped gates for the CMOS transistors.

SUMMARY OF THE INVENTION

A process is described for use in the fabrication of CMOS transistors and in particular a process for forming source and drain regions for the complementary transistors. The silicon substrate is first subjected to a first doping step so as to form first source and drain regions of a first conductivity type for first transistors. Then an oxide (silicon dioxide) layer is grown on a substrate such that a thicker oxide layer is formed over the first source and drain regions than over the selected locations for the second source and drain regions. The dopant used to form the first source and drain regions causes the oxide layer to grow more quickly at these regions. Next, the substrate is subjected to an ion implantation step with ions of a second conductivity type at an energy level selected such that the thicker oxide layer substantially blocks the ions. Therefore, the ions are implanted at the locations selected for the second source and drain regions, thereby forming the transistors of the second conductivity type.

With the above process only a single masking step is needed and no counter doping is used. Moreover, the process lends itself to doping gate members so that n-channel transistors are formed having n-type polysilicon gates, and p-channel transistors are formed having p-type polysilicon gates.

BRIEF DESCRIPTION OF THE DRAWINGS

FIG. 1 is a cross-sectional elevation view of a substrate which includes a first region prepared for transistors of a first conductivity type and a second region prepared for transistors of the second conductivity type.

FIG. 2 illustrates the substrate of FIG. 1 after polysilicon gates have been formed over the first and second regions.

FIG. 3 illustrates the substrate of FIG. 2 after a photoresist layer has been formed over the second region and during an ion implantation step.

FIG. 4a illustrates the substrate of FIG. 3 after an oxide layer is grown on the substrate and during an ion implantation step.

FIG. 4b illustrates the substrate of FIG. 3 after removal of silicon nitride masking members and after growth of an oxide layer on the substrate, and during an ion implantation step. (FIG. 4a and 5a illustrate alternate processing when compared to FIGS. 5a and 5b.)

FIG. 5a illustrates the substrate of FIG. 4a after the ion implantation step used to form source and drain regions for the second transistors.

DETAILED DESCRIPTION OF THE INVENTION

Figure 5B:
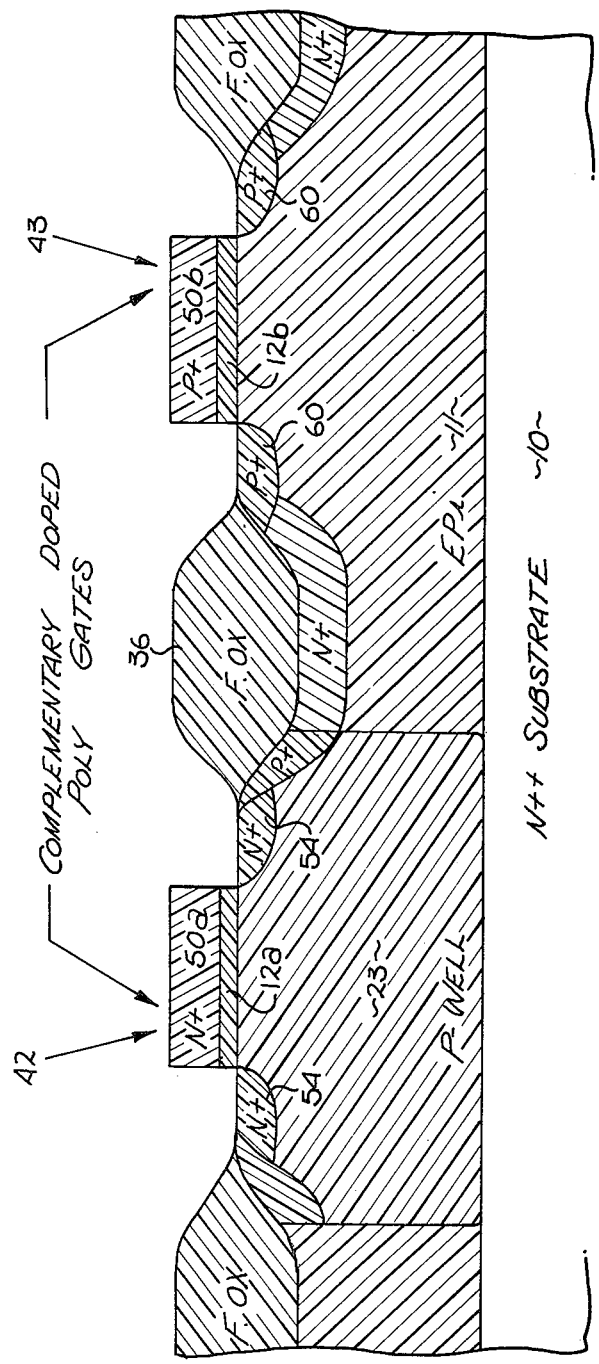
FIG. 5b illustrates the substrate of FIG. 4b after the ion implantation step used to form the source and drain regions for the second transistors.

An improvement in the integrated circuit processing of complementary metal-oxide-semiconductor (CMOS) transistors is described. In particular, the improvement involves the formation of the source/drain regions for the complementary transistors. In the following description, numerous specific details are set forth such as specific dopants, doping levels, etc., in order to provide a thorough understanding of the present invention. It will be obvious to one skilled in the art that the present invention may be practiced without these specific details. In other instances, well-known steps such as cleaning steps, etc., are not set forth in detail in order not to obscure the present invention in unnecessary detail.

Most typically in the fabrication of CMOS transistors, initial "front-end" processing is used to form guardbands in the substrate which separate the complementary transistors. These guardbands may be formed in conjunction with the growth of field-oxide regions. In FIG. 1, a substrate is illustrated which includes a first region 42 (prepared as a host region for an n-channel transistor) and a second region 43 (prepares as a host region for a p-channel transistor). These regions are separated by a field-oxide region 36. A guardband comprising the p+ region 33 and the n+ region 45 separate the regions 42 and 43. A p-well 23 is disposed in the substrate at the first region 43 in order that an n-channel transistor can be formed. This region is ion implanted as indicated by region 27 to adjust the threshold voltage for the n-channel transistor. A gate oxide layer 12a is shown at region 42 and a gate oxide layer 12b is shown at region 43.

In the presently preferred embodiment, the complementary transistors are formed in an epitaxial layer 11 which layer is grown on a highly doped (n++) monocrystalline silicon substrate 10. The specific process for forming the host regions 42 and 43 and the guardbands is described in copending application Ser. No. 382,050, filed June 10, 1982, entitled "Method for Fabricating CMOS Devices With Guardband", assigned to the assignee of the present invention, now U.S. Pat. No. 4,412,375. While the processing described in this copending application is preferred, it is not critical to the invention of this application and in particular to the formation of the complementary source and drain regions.

In the following description, two embodiments of the present invention are described. In one embodiment, (FIGS. 4a and 5a) the polysilicon gates of the complementary transistors are doped with a dopant of the same conductivity type. In the other embodiment, (FIGS. 4b and 5b) the polysilicon gates are doped such that the n-channel transistor has an n-type gate; and the p-channel transistors, a p-type gate. It has been found that for very short channel transistors, an n-type gate has an unfavorable work function for a p-channel transistor, and a p-type gate has an unfavorable work function for n-channel transistors. The invented process readily lends itself to forming the complementary gates while the complementary source and drain regions are formed. Note that the formation of complementary gates is very difficult to obtain with prior art processing where counter-doping is employed.

PROCESS FLOW FOR COMPLEMENTARY SOURCE/DRAIN REGIONS WHERE GATES ARE OF THE SAME CONDUCTIVITY TYPE

A polycrystalline silicon (polysilicon) layer is formed over the substrate of FIG. 1. In the presently preferred embodiment, this layer is approximately 3250 A thick and is doped with an n-type dopant such as phosphorus. A silicon nitride layer of approximately 400 A thick is then formed over the polysilicon layer. Ordinary masking and etching steps are used to form the structure of FIG. 2, namely a polysilicon gate 50a with an overlying silicon nitride member 51a and a polysilicon gate 50b with an overlying silicon nitride member 51b.

Next, a photoresist layer is formed over the entire substrate and an ordinary masking and etching step is used to expose the host regions associated with one of the transistor types. More specifically, for the presently preferred embodiment, region 42 is exposed as shown in FIG. 3 while region 43 remains covered by the photoresist layer 52. The substrate is now subjected to an ion implantation step as indicated by lines 53. An n-type dopant is implanted in alignment with the gate member 50a to form the source/drain regions 54. In the presently preferred embodiment, arsenic is implanted at an energy level of approximately 60 keV to obtain a concentration of $4.0 \times 10^{15}$ Ions/cm$^2$. This photoresist layer 52 blocks the ions and prevents doping of region 43.

After the photoresist 52 is removed, the substrate is subjected to an oxidation step to grow an oxide (silicon dioxide) layer over the substrate. (FIG. 4a shows this oxide layer which is illustrated as layers 56 and 57. Note at this point in the processing regions 60 have not been formed.) In the presently preferred embodiment, the substrate is subjected to 920 degrees C. to grow the oxide layers 56 and 57, shown in FIG. 4a. Oxide layer 56 grows substantially thicker than the oxide layer 57 since oxide layer 56 is grown over more heavily doped silicon. In the presently preferred embodiment, oxide layer 56 is grown to a thickness of approximately 700 A; this results in a thickness of approximately 350 A for the oxide layer 57 which is formed adjacent to the gate 50b. No oxide grows on the gate 50a and 50b because of the overlying silicon nitride members 51a and 51b, respectively. This high temperature oxidation drives in the arsenic to fully form the source/drain region 54.

While in the presently preferred embodiment the oxide layers 56 and 57 are grown in a dry atmosphere, these layers may be grown in a wet atmosphere. When this is done, the ratio of thicknesses for layers 56 and 57 is more pronounced, and may be as high as 4 to 1.

Now the substrate is subjected to ion implantation as indicated by lines 59 of FIG. 4a. The energy level for this ion implantation is selected such that the ions penetrate the oxide layer 57 to form the p-type source/drain regions 60 of FIG. 4a; the energy level, however, is low enough to prevent the ions from penetrating the oxide layer 56 and thus affecting the doping level within the source/drain regions 54. In the presently preferred embodiment, boron difluoride ions (BF2+) at an energy level of 50 kev to a concentration of $4 \times 10^{15}$ Ions/cm$^2$. The difluoride is quite massive and prevents the boron ions from being implanted in the regions 54, due to its short penetrating range. The fluorine is driven off in subsequent processing and does not effect the electrical characteristics of the device. If ordinary boron were implanted (B11), it would have to be done at a substantially lower energy and would require substantially more time to implant.

It should be noted that the boron implantation does not substantially penetrate the silicon nitride members 51a and 51b, and hence, the n-type dopant in the gates remains unaffected.

After the oxide layers 56 and 57 have been removed and the silicon nitride members 51a and 50b removed, the resultant structure is shown in FIG. 5a. It comprises an n-channel transistor at region 42 and a p-channel transistor at region 43, both with n-type gates.

The above process takes advantage of the fact that an oxide grows more quickly over heavily doped silicon than over lightly doped silicon. A single oxidation step grows the oxide layers 56 and 57 of FIG. 4a with layer 56 growing more quickly because of the underlying source/drain regions 54. Then as shown in FIG. 4a, a sheet implant (without masking) can be used to dope regions 60, without counter doping regions 54. Thus, complementary source drain regions are formed with a single masking step and without counter doping.

Note that while for the above description the photoresist 52 was placed at region 43, it could just have well been first formed at region 42 and a p-type dopant used to first form the p-channel transistor. Then, during the subsequent oxidation, a thicker oxide layer is formed over the regions 60, allowing ion implantation of an n-type dopant in alignment with gate 50a through the thinner oxide.

In the presently preferred embodiment, silicon nitride members 51a and 51b are employed. These members are not necessary for the present invention, however, they are helpful in the currently employed processing. For one thing, they allow undercutting of the gate member 50a (FIG. 3) and permit shadow doping as is well-known. Also, the silicon nitride members prevent the boron dopant from counter doping the n-type gates (FIG. 4a). The silicon nitride is also used as part of a tungsten metallization process, not pertinent to the present invention.

PROCESS FLOW FOR COMPLEMENTARY SOURCE/DRAIN REGIONS WITH COMPLEMENTARY GATES

For the formation of the complementary gates, undoped polysilicon is formed over the substrate of FIG. 1. Then as shown in FIG. 2, masking members are employed to form the gates 50a and 50b. The silicon nitride members 51a and 51b need not be used for forming the gates.

Now as shown in FIG. 3, a photoresist layer is formed over region 43 to allow the doping of regions 54 and the gate 50a. For this process flow, the silicon nitride member 51a is removed or not used to allow the n-type dopant to dope the gate 50a or a high enough energy level is used so that the ions penetrate the silicon nitride member 51a to dope the gate 50a. This energy level should be low enough to prevent the doping of regions 60 or of gate 50b.

Now the photoresist layer 52 is removed, along with the silicon nitride members (if any are remaining) and the substrate is subjected to an oxidation step. As shown in FIG. 4b, substantially thicker oxide layer 56 grows over the source/drain regions 54 and gate 50a than the thinner oxide layer 57 which grows on and adjacent to the gate 50b. Now the substrate is subjected to ion implantation as indicated by lines 58 of FIG. 4b. The energy level is once again selected so that the ions penetrate the oxide layer 57 and not the oxide layer 56. This causes the formation of the p-type region 60 in alignment with gate 50b and simultaneously dopes the gate 50b.

The resultant structure is shown in FIG. 5b, namely an n-channel transistors with an n-type gate at region 42 and a p-channel transistor with a p-type gate at region 43.

Well known "rear end" processing steps may now be used to complete the CMOS transistor such as the formation of passivation layers and metallization to form contacts and interconnects.

While in the above description reference is made to the growth of an oxide layer (silicon dioxide) other insulative layers which grow more quickly over doped silicon may be used. For example, it may be possible to use certain nitridized oxide layers to obtain the same result.

Thus, improved processing steps for the formation of source/drain regions in complementary MOS transistors has been described. A single masking step permits formation of the complementary source/drain regions without counter doping. The process permits the formation of complementary doped polysilicon gates or may be used to form gates of the same conductivity type.

I claim:

1. In the fabrication of complementary metal-oxide-semiconductor (CMOS) transistors on a silicon substrate, the improvement comprising the steps of:
   subjecting said substrate to a doping step so as to form first source and drain regions of a first conductivity type for first transistors;
   growing an insulative layer on said substrate such that a thicker insulative oxide layer is formed over said first source and drain regions than over locations for second source and drain regions for second transistors;
   subjecting said substrate to ion implantation with ions of a second conductivity type at an energy level selected such that said thicker insulative layer substantially blocks said ions of said second conductivity type, thereby forming said second source and drain regions,
   whereby CMOS transistors are formed in said substrate.

2. The improvement defined by claim 1 wherein gate members for said first transistors are doped with said first conductivity type dopant when said first source and drain regions are formed.

3. The improvement defined by claim 2 wherein gate members for said second transistors are implanted with said ions of said second conductivity type when said second source and drain regions are formed.

4. The improvement defined by claim 1 wherein gate member for said first and second transistors are covered with silicon nitride when said insulative layer is grown.

5. In the fabrication of complementary metal-oxide-semiconductor (CMOS) transistors on a silicon substrate, where first predetermined regions are used for first transistors of a first conductivity type and second predetermined regions are used for second transistors of a second conductivity type, the improvement comprising the steps of:
   covering said second predetermined regions while leaving said first predetermined regions exposed;
   subjecting said substrate to a doping step with a dopant of a first conductivity type such that first source and drain regions are formed for said first transistors;
   growing an insulative layer on said substrate such that a thicker layer is formed over said first source and drain regions than over at least portions of said second predetermined regions,
   subjecting said substrate to ion implantation with ions of a second conductivity type at an energy level selected such that said thicker layer substantially blocks said ions of said second conductivity type, while allowing said ions to penetrate said layer over said second predetermined regions, thereby forming second source and drain regions for said second transistors,
   whereby CMOS transistors are formed in said substrate.

6. The improvement defined by claim 5 wherein gate members for said first transistors are doped with said first conductivity dopant when said first source and drain regions are formed.

7. The improvement defined by claim 6 wherein gate members for said second transistors are implanted with said ions of said second conductivity type when said second source and drain regions are formed.

8. The improvement defined by claim 7 wherein said insulative layer is a silicon dioxide layer.

9. The improvement defined by claim 5 wherein gate members for said first and second transistors are covered with silicon nitride when said insulative layer is grown.

10. The improvement defined by claim 9 wherein said insulative layer is silicon dioxide.

11. In a process for fabricating complementary metal-oxide-semiconductor (CMOS) transistors on a silicon substrate, the improvement comprising the steps of:
   forming first and second polysilicon gate members insulated from said substrate;
   forming first source and drain regions of a first conductivity type in general alignment with said first gate members;
   growing an oxide layer on said substrate such that a thicker oxide layer is formed over said first source and drain regions than is grown adjacent to said second gate members since said substrate is more heavily doped at said first source and drain regions;
   subjecting said substrate to ion implantation with an ion of the second conductivity type at an energy level selected such that said thicker oxide layer substantially blocks said ions of said second conductivity type, thereby forming second source and drain regions of said second conductivity type in general alignment with said second gate members, whereby CMOS transistors are formed.

12. The improvement defined by claim 11 including, after forming of said gate members, the steps of:
   forming a photoresist layer over said substrate,
   removing portions of said photoresist layer so as to expose sites for said first source and drain regions.

13. The improvement defined by claim 12 wherein said first gate members are doped to said first conductivity type when said first source and drain regions are formed.

14. The improvement defined by claim 13 wherein said second gate members are doped to said second conductivity type by said ions when said second source and drain regions are formed.

15. The improvement defined by claim 11 wherein said first and second gate members are formed from a doped layer of polysilicon and include overlying silicon nitride members, and wherein said silicon nitride members prevent growth of said oxide layer on said gate members.

16. The improvement defined by claim 11 wherein said ions are weighted with other atoms.

17. The improvement defined by claim 16 wherein said ions are boron ions weighted with fluorine.

* * * * *